US012750059B2

(12) United States Patent
Boecker et al.

(10) Patent No.: US 12,750,059 B2
(45) Date of Patent: Sep. 29, 2026

(54) CLOCKING SYSTEM FOR A SYSTEM ON CHIP USING PLL

(71) Applicant: Microsoft Technology Licensing, LLC, Redmond, WA (US)

(72) Inventors: Charles Walter Boecker, Ames, IA (US); Eric Douglas Groen, Ankeny, IA (US); Subramanian Krishnamoorthy, San Ramon, CA (US); Shaishav Achyut Desai, San Jose, CA (US); Gurupada Mandal, San Jose, CA (US); Ravi Shivnaraine, Pickering (CA); Jaskarn S. Johal, Raleigh, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 18/756,905

(22) Filed: Jun. 27, 2024

(65) Prior Publication Data

US 2026/0005694 A1 Jan. 1, 2026

(51) Int. Cl.
*H03L 7/081* (2006.01)
*H03L 7/08* (2006.01)
*H03L 7/083* (2006.01)

(52) U.S. Cl.
CPC .......... *H03L 7/0816* (2013.01); *H03L 7/0805* (2013.01); *H03L 7/083* (2013.01)

(58) Field of Classification Search
CPC ..... H03L 7/0816; H03L 7/0805; H03L 7/083; H03L 7/0891; H03L 7/089; H03L 7/08; H03L 7/06; H03L 7/099; H03K 5/133; H03K 5/134; H03K 5/14
See application file for complete search history.

(56) References Cited

U.S. PATENT DOCUMENTS

2006/0017512 A1* 1/2006 Huang .................. H03L 7/0816 331/17
2020/0007082 A1 1/2020 Robinson

OTHER PUBLICATIONS

International Search Report and Written Opinion, dated Aug. 27, 2025, for International Patent Application No. PCT/US2025/019307. (26 pages).
Invitation to pay additional search fee Received in PCT Application No. PCT/US2025/019307, mailed on Jul. 4, 2025, 15 pages.

* cited by examiner

*Primary Examiner* — Jung Kim
(74) *Attorney, Agent, or Firm* — Seed Intellectual Property Law Group LLP

(57) ABSTRACT

The described technology provides a device including a phase locked loop (PLL) circuit, the PLL circuit including a voltage controlled oscillator (VCO) and a phase detector, and a voltage supply and transconductance cell (Gm) configured to drain a current Iout from the VCO based on a sensed voltage (Vsup_sense) input into the Gm, wherein the Gm cell is configured to generate an open_loop signal based on the Iout drain from the VCO.

20 Claims, 13 Drawing Sheets

CLOCKING SYSTEM FOR A SYSTEM ON CHIP USING PLL

BACKGROUND

Modern electronic and computing systems use logic configured on system on chip (SoC) architecture. Often, the logic implemented on SoCs have drain current with large slope (di/dt). For example, such large di/dt events occur when the logic may be processing large amount of data. The large slope of the drain current di/dt often causes the level of the supply voltage to dip below Vmin, which is the minimal working voltage of the SoC for any workload or operating condition at a specific clock frequency. Such drooping of the supply voltage below Vmin may cause the timing logic on the SoC to fail and thus result in corruption of the data.

SUMMARY

The described technology provides a device including a phase locked loop (PLL) circuit, the PLL circuit including a voltage controlled oscillator (VCO) and a phase detector, and a voltage supply and transconductance cell (Gm) configured to drain a current Iout from the VCO based on a sensed voltage (Vsup_sense) input into the Gm, wherein the Gm cell is configured to generate an open_loop signal based on the Iout drain from the VCO.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

FIG. 1 illustrates an example implementation of a clocking system for a system of chip (SoC) using the phase-locked loop (PLL) disclosed herein.

FIG. 2 illustrated various example graphs at various points in the clocking system disclosed herein.

FIG. 3 illustrates example operational phase of the clocking system disclosed herein where the PLL operates in a locked loop phase.

FIG. 4 discloses another example operational phase of the clocking system disclosed herein where the PLL operates in a locked loop phase.

DETAILED DESCRIPTIONS

Modern electronic and computing systems use logic configured on system on chip (SoC) architecture. Often, the logic implemented on SoCs have drain current with large slope (di/dt). For example, such large di/dt events occur when the logic may be processing large amount of data. The large slope of the drain current di/dt often causes the level of the supply voltage to dip below Vmin, which is the minimal working voltage of the SoC for any workload or operating condition at a specific clock frequency. Such drooping of the supply voltage below Vmin may cause the timing logic on the SoC to fail and thus result in corruption of the data.

Implementations disclosed herein disclose a clocking system for a system on chip (SoC) including a phase locked loop (PLL) that responds to a droop in the supply with a fast response time. Specifically, when the PLL is operating in a normal mode, when the supply voltage is above Vmin, the PLL provides a frequency stable clock to the logic of the SoC. As the supply voltage approaches Vmin, the PLL disclosed herein transitions to a second mode of operation that is not locked to the input of the data. The operation of the PLL in the second mode opens the loop of the PLL and reduces the frequency of operation, wherein the reduction in the frequency of operation is proportional to the difference between the supply voltage and Vmin. In other words, the reduction in the frequency of operation is proportional to the amount by which the supply voltage is below Vmin. This decrease in frequency of the clock ensures that the logic on the SoC does not fail the timing.

Furthermore, in the illustrated operations, once the supply voltage is above Vmin, a third mode of operation is enabled. In the third mode, the PLL relocks to a reference clock. During the third phase, a phase interpolator (PI) operates in a rotating mode with a step such that it ensures that the cycle time of the clock is not above the minimum cycle time that the logic of the SoC can withstand. For example, in one implementation, in the third phase, the PI operates with a step of approximately 10 pico-seconds (ps). Once the PLL is locked, the PI stops rotating, and the clocking system operates back in the normal mode of operation.

Figure 1:
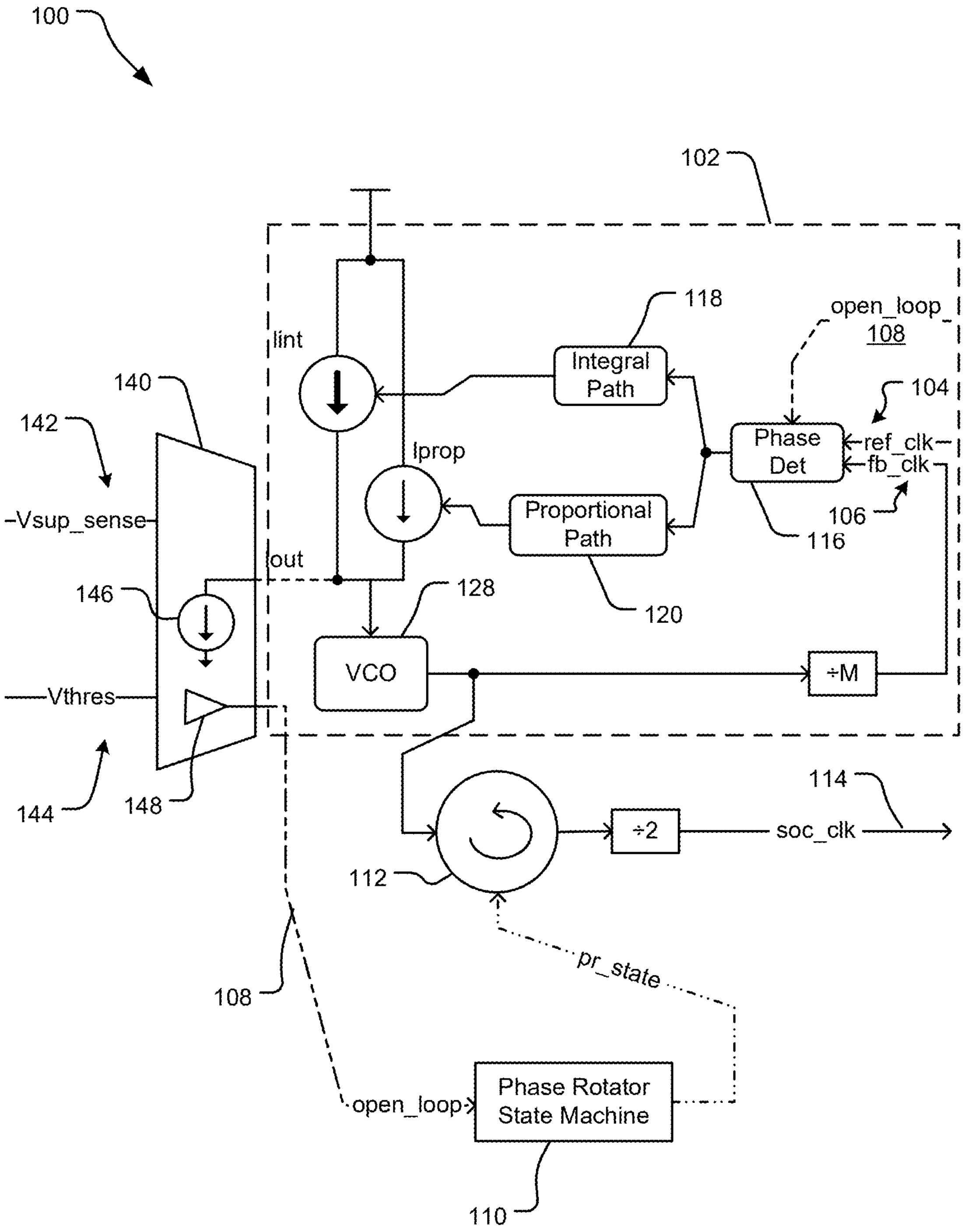

Now referring to the implementations disclosed herein, FIG. 1 illustrates a clocking system 100 disclosed herein that responds to a droop in the supply with a fast response time. The clocking system 100 includes various components of the PLL circuit 102 including a phase detector 116 and a voltage-controlled oscillator (VCO) 128. The output frequency of the VOC 128 may be controlled by a variety of DC input voltages. The VCO 128 may generate an output signal that is maintained at the setpoint frequency by the PLL circuit 102 and locked to the reference frequency in a locked state of the PLL circuit 102.

In a normal mode of operation, the PLL circuit 102 may operate in a linear manner when it is locked. In this mode, a phase error or offset between a reference clock signal 104 and a feedback clock signal 106 linearly changes an output current Iprop. The output current Iprop is illustrated as being coupled to the VCO 128 via a proportional path circuit 120. The response time of the proportional path circuit 120 is, for example, with a bandwidth of around 5 MHz.

Additionally, the implementation of the PLL circuit 102 includes an integral path circuit 118 that is a low-frequency path that can be used to address the drift in the output current due to changes in temperature and voltage. The output current lint of the integral path circuit 118 has a linear response as well. However, the response time of the integral path circuit 118 is lower, such as for example with a bandwidth of around 100 KHz.

Each of the lint and Iprop are used to control the VCO input current Ivco to the VCO 128. The VOC 128 is a current controlled oscillator where its cycle time decreases linearly as the input current decreases. Specifically, the VCO 128 operates in linear mode in that the cycle time of the VCO 128 is linear with respect to the VCO input current Ivco.

The clocking system 100 also includes a voltage supply and transconductance cell (Gm) 140 that converts the difference between a sensed voltage Vsup-sense 142 and a programmable threshold voltage Vthres 144 into a current Iout 146 that it pulls from the VCO 128. Here the programmable threshold voltage Vthres 144 is programmable in that a user or system can set its value. The Iout 146 is summed, as shown by 146, and multiplied by a programmable gain 148 to generate the summed output open_loop signal 108. The programmable threshold voltage Vthres 144 and the programmable gain 148 can be programmed by a user to determine the slope of the cycle time versus input voltage. The graph illustrating the Iout 146 with respect to the Vsup-sense 142 is further illustrated below in FIG. 2 as graph 206. The summed output open_loop voltage 150 may be used as an open_loop signal 108 input into the phase detector 116 of the PLL 102.

The open_loop signal 108 is input of the phase detector 116. When open_loop signal 108 is zero (0) the PLL is in the open loop state and the phase detector 116 provides constant output current Iprop. In this state, irrespective of the phase offset between the reference clock 104 and the feedback clock 106, the Iprop maybe, for example, is 0.5 mA.

The output from the VCO 128 is input into a phase rotator (PR) 112 that is controlled by a phase rotator state machine (PRSM) 110. The PR 112 generates a clock signal that is divided by two to generate the SoC_clk 114 for the SoC. The PR 112 ensures that during locking of the PLL, any overshoot with less than desired cycle time in the clock signal output from the VCO 128 is not seen by the other components of the SoC. As shown herein and further explained below in FIGS. 3-8, the PRSM 100 is also controlled by the open_loop signal 108 output by the Gm 140.

Specifically, as illustrated below in FIGS. 3-8, as the Vsup_sense approaches Vmin the PLL 102 transitions to second mode of operation that is not locked to the input of the data. Specifically, the PLL 102 operates in an open loop phase and increases the cycle time of the SoC clock 114. This ensures that the logic on the SoC does not fail timing as a result of droop in the Vsup_sense.

The clocking system disclosed herein allows the SoC to operate with lower voltage as it allows detecting the droops and ensures that the droop does not impact the timing of the logic on the SoC. Such operating of the SoC with lower voltage can save, for example, 5-15% of the SoC power.

Figure 2:
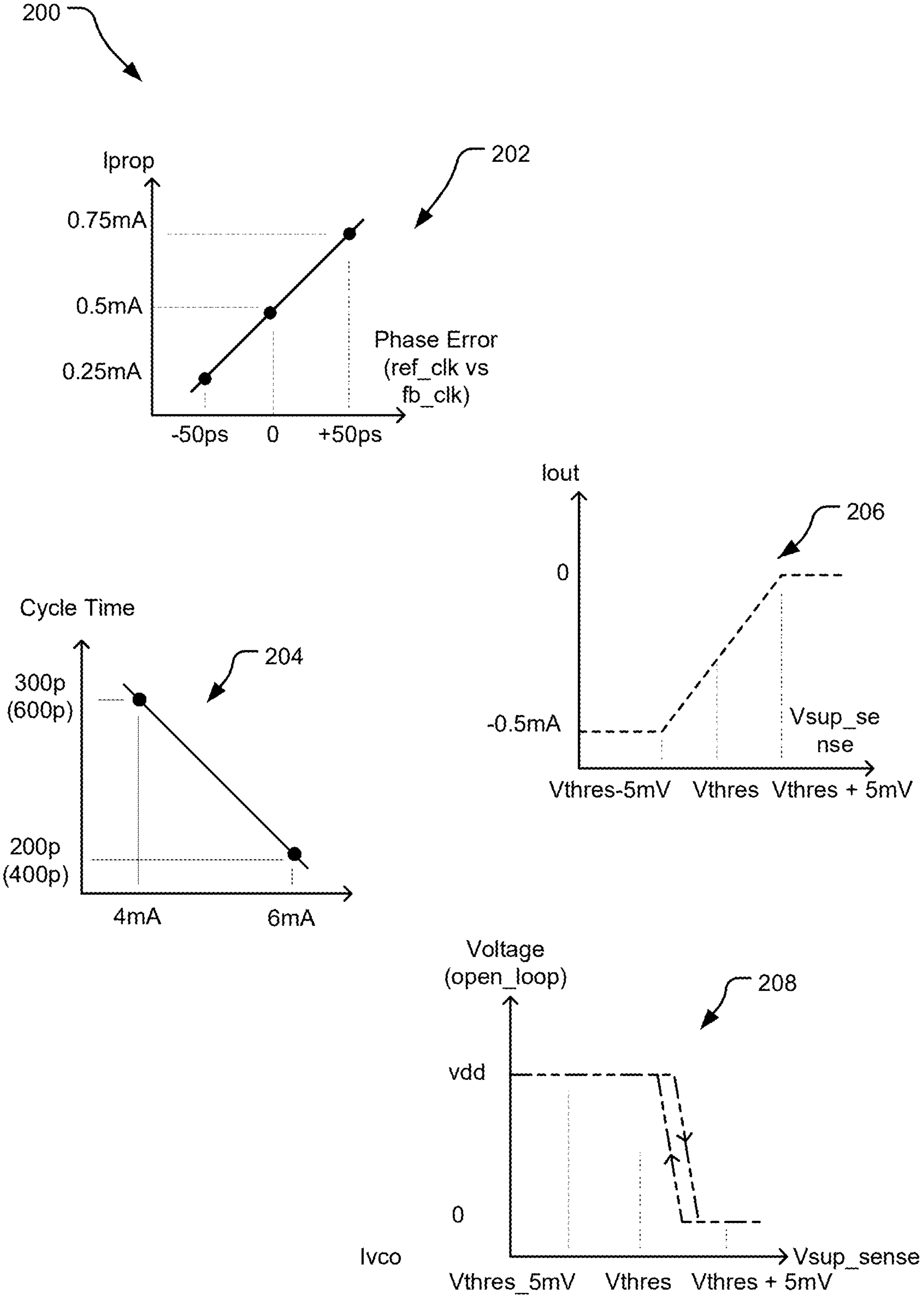

FIG. 2 illustrated various graphs 200 at various points in the clocking system 100. Specifically, 202 illustrates a graph of the Iprop output from the phase detector 116 which indicates a linear relation between phase offset on the x-axis and the output current Iprop on the y-axis.

The graph 204 illustrates a graph of the linear response of the VCO with the VCO input current Ivco on the x-axis and the cycle time of the VCO on the y-axis. Thus, for example, a 4 mA of Ivco input to the VCO generates 600 ps of cycle time, whereas a 6 mA of Ivco input to the VCO generates 400 ps of cycle time.

The graph 206 illustrates a graph of Iout, the current that is stolen by the Gm cell that is based on the values of the sensed supply voltage Vsup_sense 142 and the programmable threshold voltage Vthres 144 as show in FIG. 1. As shown, the current Iout is linear over a small window around Vthres and is non-linear outside that window. Specifically, the graph 106 illustrates that over the linear window around Vthres, the Gm cell 140 pulls current from the VCO 128. In one implementation, the slope of the relation between Iout and the sensed supply voltage Vsup_sense 142 may be programmable as well.

The graph 208 illustrates the summed output open_loop voltage 150 as a function of the Vsup_sense 142 and Vthres 144. Specifically, as shown the relation between the summed output open_loop voltage 150 as a function of the Vsup_sense 142 and Vthres 144 shows hysteresis.

Figure 3:
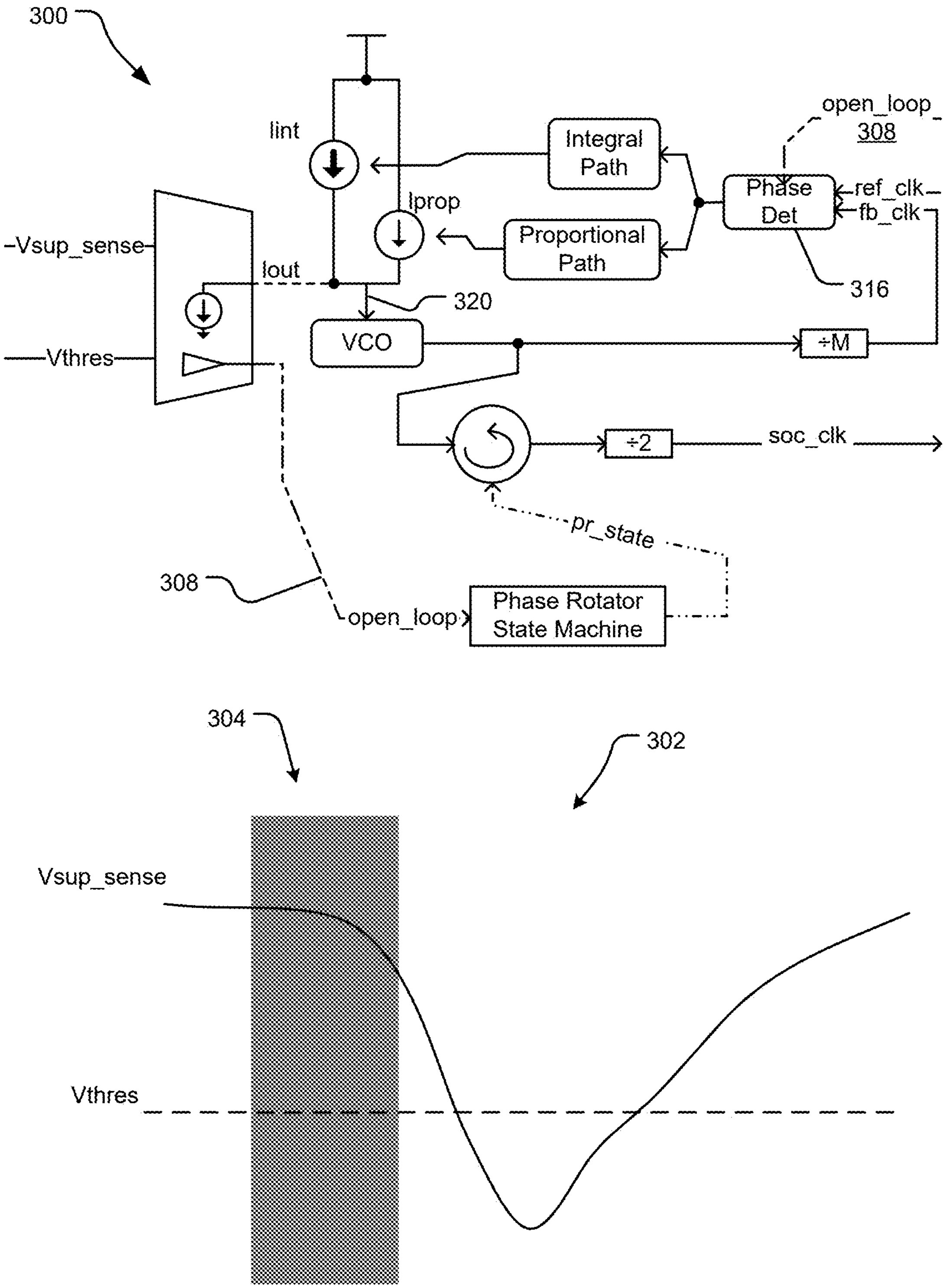

FIG. 3 illustrates example operational phase of the clocking system 300 disclosed herein where the PLL operates in a locked loop phase. Specifically, the phase illustrated herein assumes that the cycle time of the clocking system is locked at 500 ps, corresponding to Ivco 320 of 5 mA. During this phase, given that the open_loop signal 308 is zero (0) the phase detector 316 is active.

FIG. 3 also illustrates a graph 302 of a droop event in the supply voltage Vsup_sense where the supply voltage Vsup_sense is above a threshold voltage Vthres, as shown by the region 304.

Figure 4:
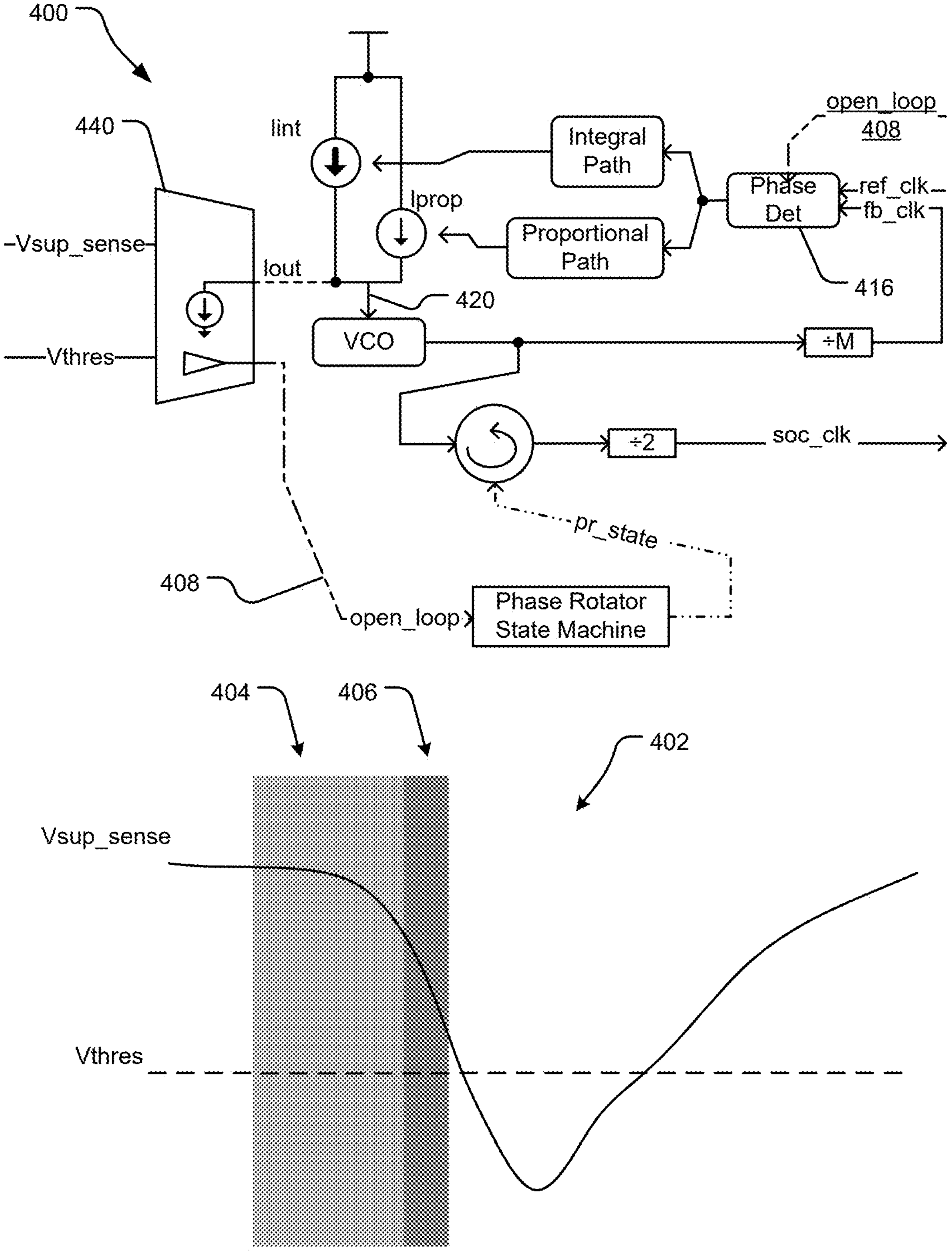

FIG. 4 illustrates another example operational phase of the clocking system 400 disclosed herein where the PLL still operates in a locked loop phase. During this phase, given that the open_loop signal 408 is still zero (0) the phase detector 416 is active. However, during this phase the Ivco 420 is 4.97 mA, corresponding to cycle time of the clocking system is 503 ps as the Gm 440 is pushing the PLL away from 500 ps lock point. Specifically, during this phase, the Vsup_sense becomes closer to the Vthres, the Gm 440 pulls more current via Iout.

FIG. 4 also illustrates a graph 402 of a droop event in the supply voltage Vsup_sense where the supply voltage Vsup_sense is still above a threshold voltage Vthres, as shown by the region 404, but getting closer to the Vthres as shown by the region 406.

Figure 5:
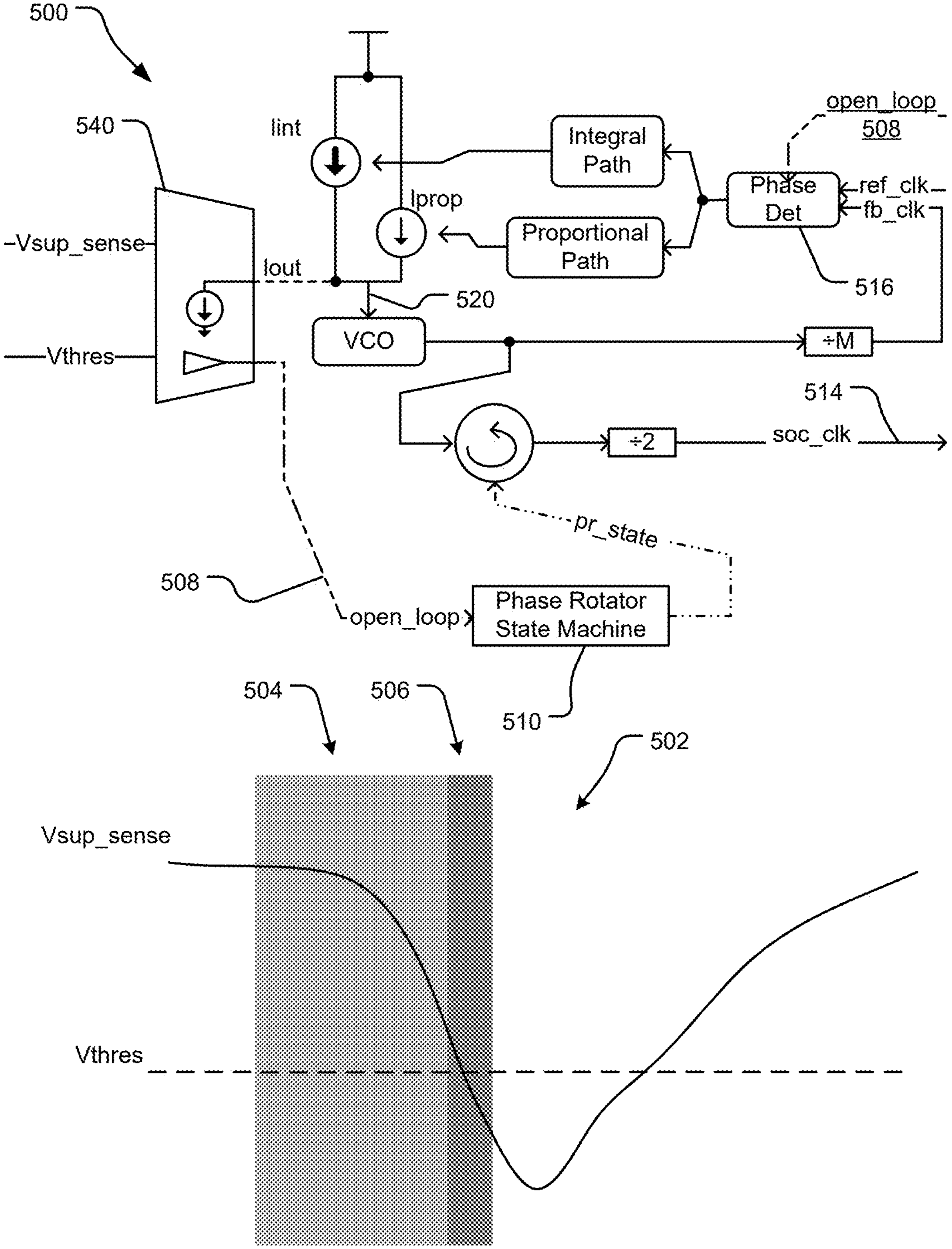
FIG. 5 illustrates another example operational phase of the clocking system disclosed herein where the PLL now operates in an open loop phase.

FIG. 5 illustrates another example operational phase of the clocking system 500 disclosed herein where the PLL now operates in an open loop phase. During this phase, given that the open_loop signal 508 is one (1) the phase detector 516 is inactive. The value of one (1) for the open_loop signal 508 arms a phase rotator state machine (PRSM) 510. As a result, the RPSM 510 captures the rising edge of the open_loop signal 508, which signals to the PRSM 510 that droop has occurred.

The value of one for the open_loop signal 508 in the phase detector opens the PLL and the cycle time is now dependent on Vsup_sense due to the Gm 540. During this phase, due to the droop of the Vsup_sense below the Vthres, the Gm 540 may pull more current via Iout. Thus, for example 100 microamp to 150 microamp current is sunk into the Gm 540. This may reduce the Ivco 520 to 4.9 to 4.85 mA, corresponding to cycle times of 510-515 ps. As the Vsup-sense decreases further, the cycle times increases linearly. This increase in cycle time (or decrease in frequency) of the soc_clock 514 ensures that any logic on the SoC doesn't fail its timing. Operating the PLL with the open_loop signal 508 of one (1) is also referred to as operating it in the second mode.

FIG. 5 also illustrates a graph 502 of a droop event in the supply voltage Vsup_sense where the supply voltage Vsup_sense is above a threshold voltage Vthres initially as shown by the region 504 but dropping below the Vthres as shown by the region 506.

Figure 6:
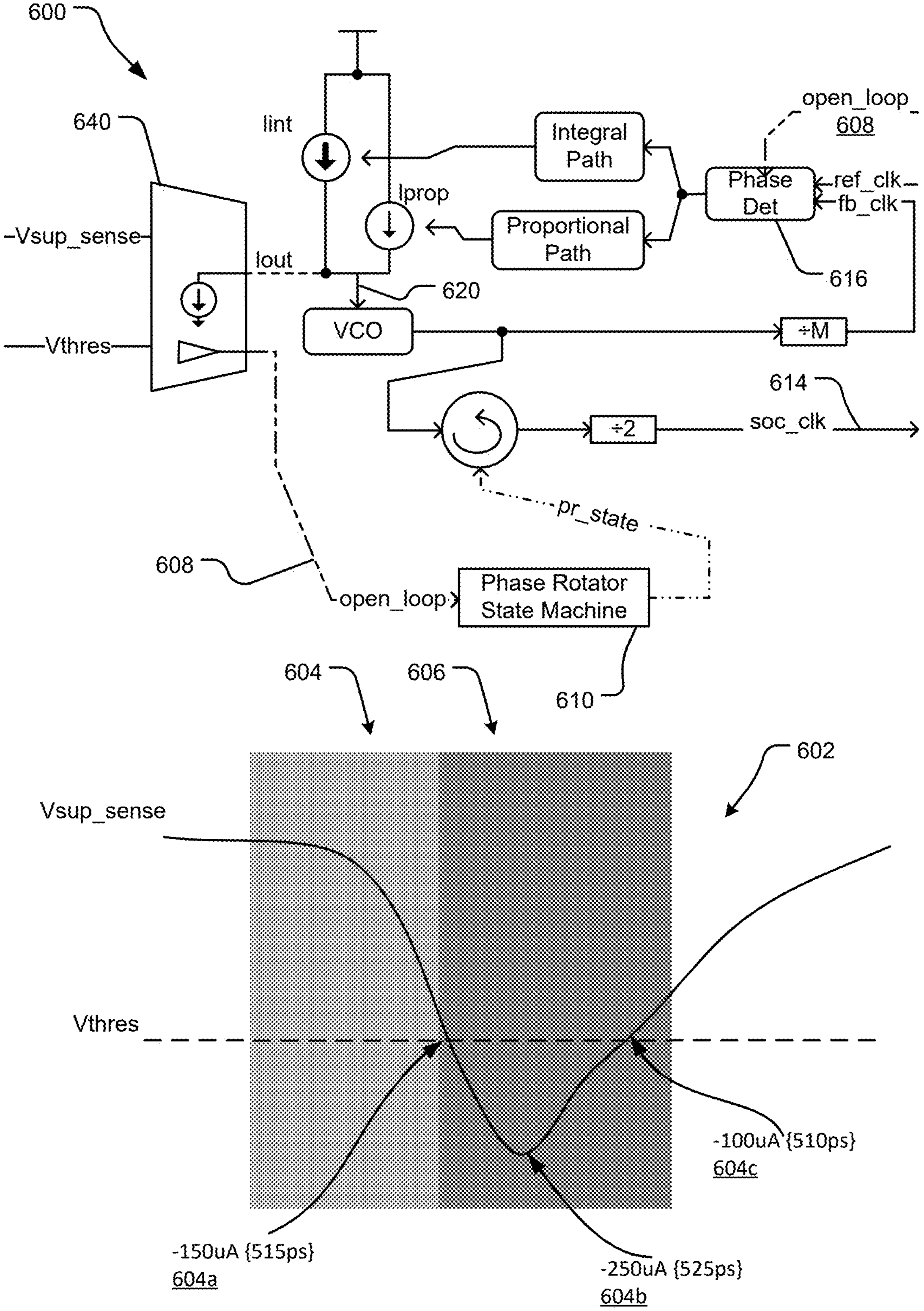
FIG. 6 illustrates another example operational phase of the clocking system disclosed herein where the PLL continues to operate in an open loop phase.

FIG. 6 illustrates another example operational phase of the clocking system 600 disclosed herein where the PLL continues to operate in an open loop phase. Specifically, here the PLL is operated with the open_loop signal 608 of one (1) and this may be considered the continuation of operating PLL in second mode in view of the continuation of the droop event for the Vsup_sense. During this phase, given that the open_loop signal 608 is one (1) the phase detector 616 is inactive. In this phase, the cycle time or frequency is dependent on Vsup_sense at the Gm 540 or the amount by which the Vsup_sense is below V_thres. Specifically, the lower the Vsup_sense is the longer is the cycle time. The lower Vsup_sense causes the Gm 640 to sink more Iout to the Gm 640. This may reduce the Ivco 520 to 4.9 to 4.75 mA, corresponding to cycle times of 510-525 ps.

FIG. 6 also illustrates a graph 602 of a droop event in the supply voltage Vsup_sense where the supply voltage Vsup_sense is above a threshold voltage Vthres initially as shown by the region 604 but dropping below the Vthres as shown by the region 606 before slightly rising above the Vthres. For example, the point 604*a* at which the operation of the PLL switches from first mode to second mode may correspond to Iout of −150 microamps and the cycle time of 515 ps. The point 604*b* where the Vsup_sense is at its lowest may correspond to Iout of −250 microamps and the cycle time of 525 ps. Similarly, the point 604*c* at which the Vsup_sense starts rising above the Vthres may correspond to Iout of −100 microamps and the cycle time of the soc_clk 614 of 510 ps.

Figure 7:
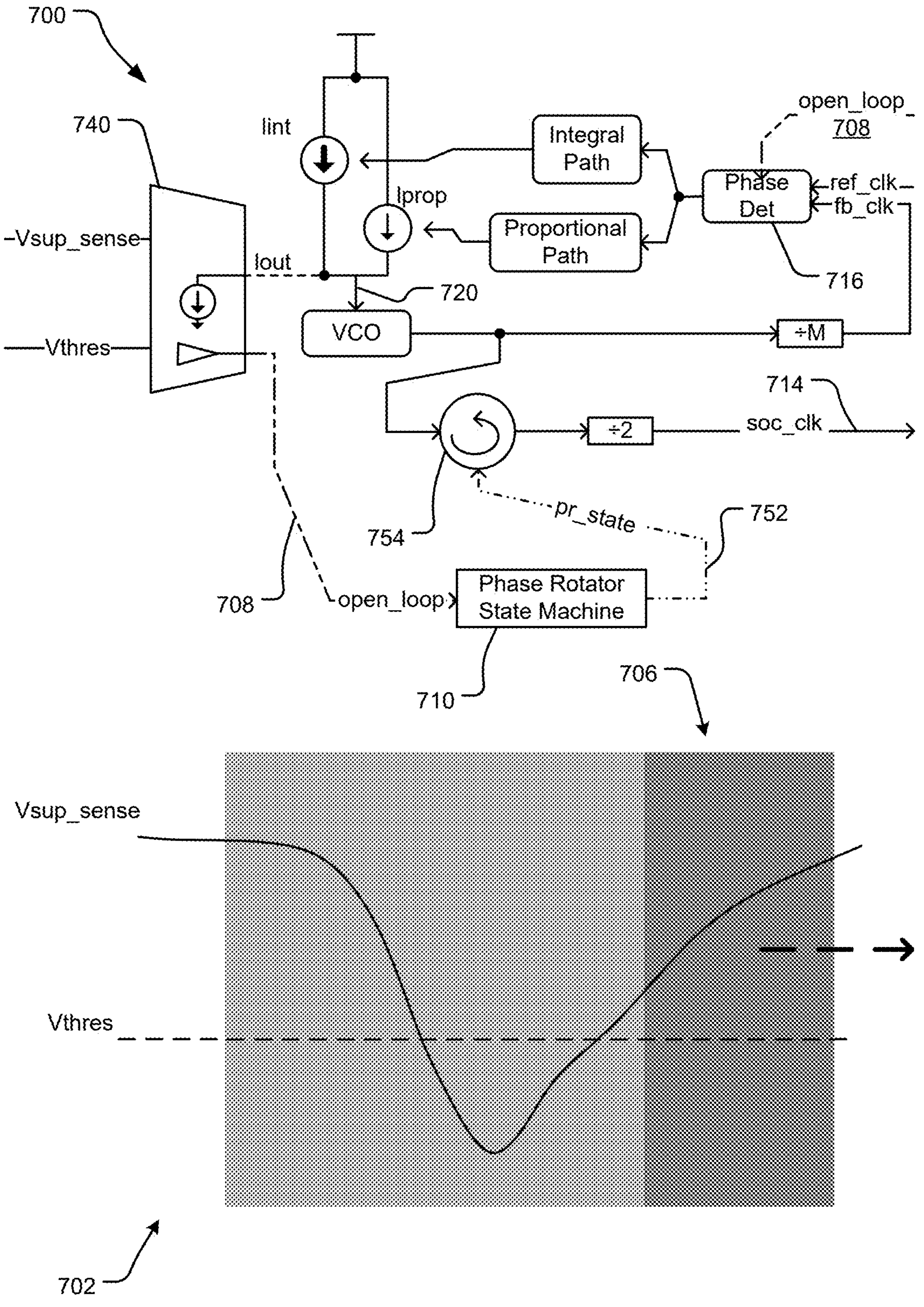
FIG. 7 illustrates another example operational phase of the clocking system disclosed herein where the PLL is again closed and allowed to lock in a cycle time.

FIG. 7 illustrates another example operational phase of the clocking system 700 disclosed herein where the PLL is again closed and allowed to lock in a cycle time. During this phase, given that the open_loop signal 708 is zero (0) the phase detector 616 is active. During this phase, as the Vsup_sense increases, the Iout sunk to the Gm 740 goes back from −100 microamp to zero (0). Subsequently, the Ivco 720 may be 4.9-5.1 mA, corresponding to cycle time of 490-510 ps. Specifically, during this phase, a phase rotator state machine (PRSM) 710 captures a falling edge of an open_loop signal 708. This signals to the PRSM 710 to start rotating to increase cycle time of the soc_clk 714. As a result, a PR_state signal input into a phase rotator (PR) 754 may cause the cycle time of the soc_clk 714 to increase to 505-525 ps plus additional 15 ps due to the PR 754. This ensures that the cycle time of the soc_clk 714 does not go below 500 ps limit.

FIG. 7 also illustrates a graph 702 of a droop event in the supply voltage Vsup_sense where the supply voltage Vsup_sense is back above a threshold voltage Vthres as shown by the region 706. Specifically, the region 706 corresponds to the open_loop signal 708 being equal to zero (0).

Figure 8:
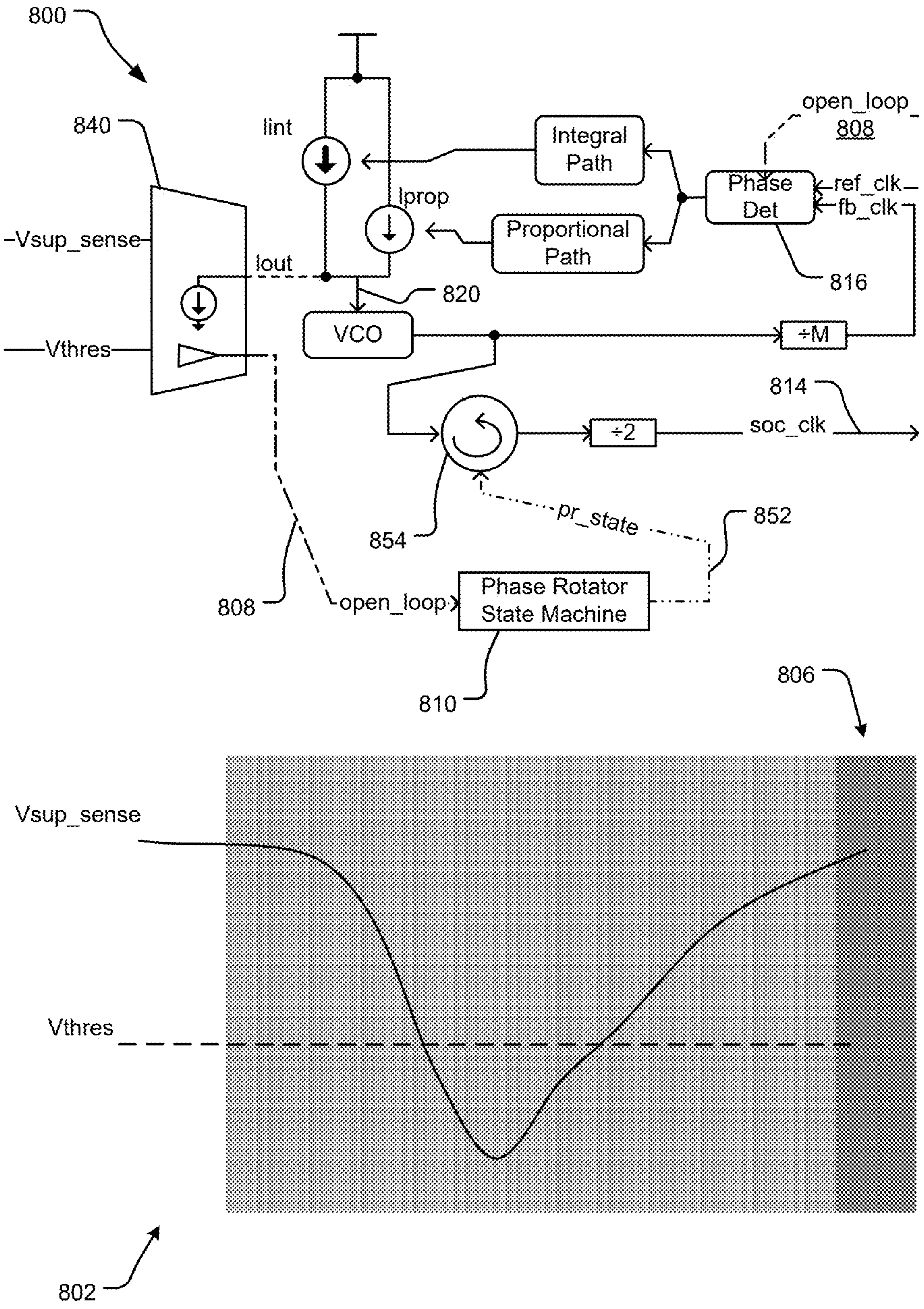
FIG. 8 illustrates another example operational phase of the clocking system disclosed herein where the PLL is still closed and locked in a cycle time.

FIG. 8 illustrates another example operational phase of the clocking system 800 disclosed herein where the PLL is still closed and locked in a cycle time. During this phase, given that the open_loop signal 808 is zero (0) the phase detector 816 is active. In this phase the PRSM 810 stops, as may be determined by a programmable counter or a lock detect signal from the phase detector 816. At this point the PLL circuit is back in the locked state. FIG. 8 also illustrates a graph 802 of a droop event in the supply voltage Vsup_sense where the supply voltage Vsup_sense is back above a threshold voltage Vthres as shown by the region 806.

As discussed above in FIGS. 3-8, the operation of the PLL in the manner disclosed herein with a Gm, such as the Gm 140, to generate an open_loop signal, a phase rotator, and a phase rotator state machine allows the SoC cycle time to be controlled in face of droop event in the Vsup_sense. The increase in the cycle times determined by the Gm, which may be continuous time Gm, provides fast response times to respond to droop events. For example, the response time to change the clock cycle in response to drop in the Vsup_sense may be less than 100 ps, with the response times in some implementations being as low as 20 ps. Specifically, the clocking system disclosed above provides more optimized frequency tracking in that it reduces the frequency of the clock signal linearly as the supply voltage drops below Vmin.

The supply modulated adaptive PLL disclosed above reduces the response times to less than 1 ns. Furthermore, these implementations also allow reducing the Vmin, which results in power savings for operation of SoCs.

Figure 9:
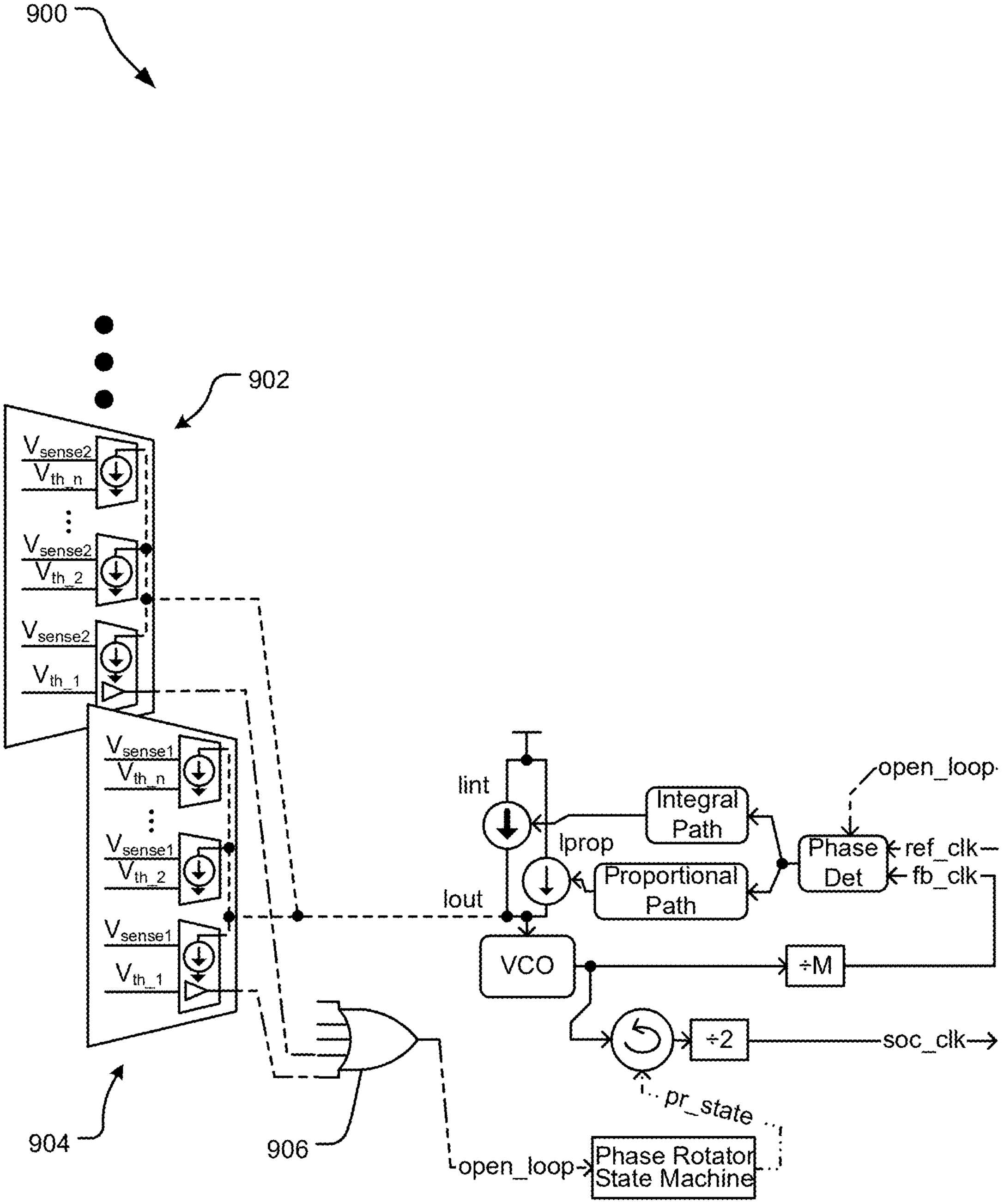
FIG. 9 illustrates an alternative implementation of the clocking system disclosed herein with multiple voltage supply and transconductance cells (Gm).

FIG. 9 illustrates an alternative implementation of the clocking system 900 disclosed herein. Specifically, the clocking system 900 that includes two Gm circuits 902, 904, each Gm circuit having its own programmable Vthres input, and each Gm circuit having its own programmable gain setting. Note that while FIG. 2 illustrates a clocking system 900 with two Gm circuits, in alternative implementation n Gm circuits may be provided. Providing multiple Gm circuits allows the clocking system 900 to provide voltage to cycle time relationship that is piecewise linear. Thus, for example, the slope of the voltage to cycle time maybe different between various programmable threshold values Vthres, with such gain controlled by the gain setting of the individual Gm circuits 902, 904. The output of the Gm circuits 902, 904 may be multiplexed by a multiplexer 906 to generate a PLL open_loop signal 908 that is input into a PRSM 920 and into a phase detector 930 of the PLL.

The clocking system 900 allows changing the overall slope of the relation between the voltage and the cycle times by controlling the threshold values of the various Gm circuits 902, 904 as well as their gains.

Figure 10:
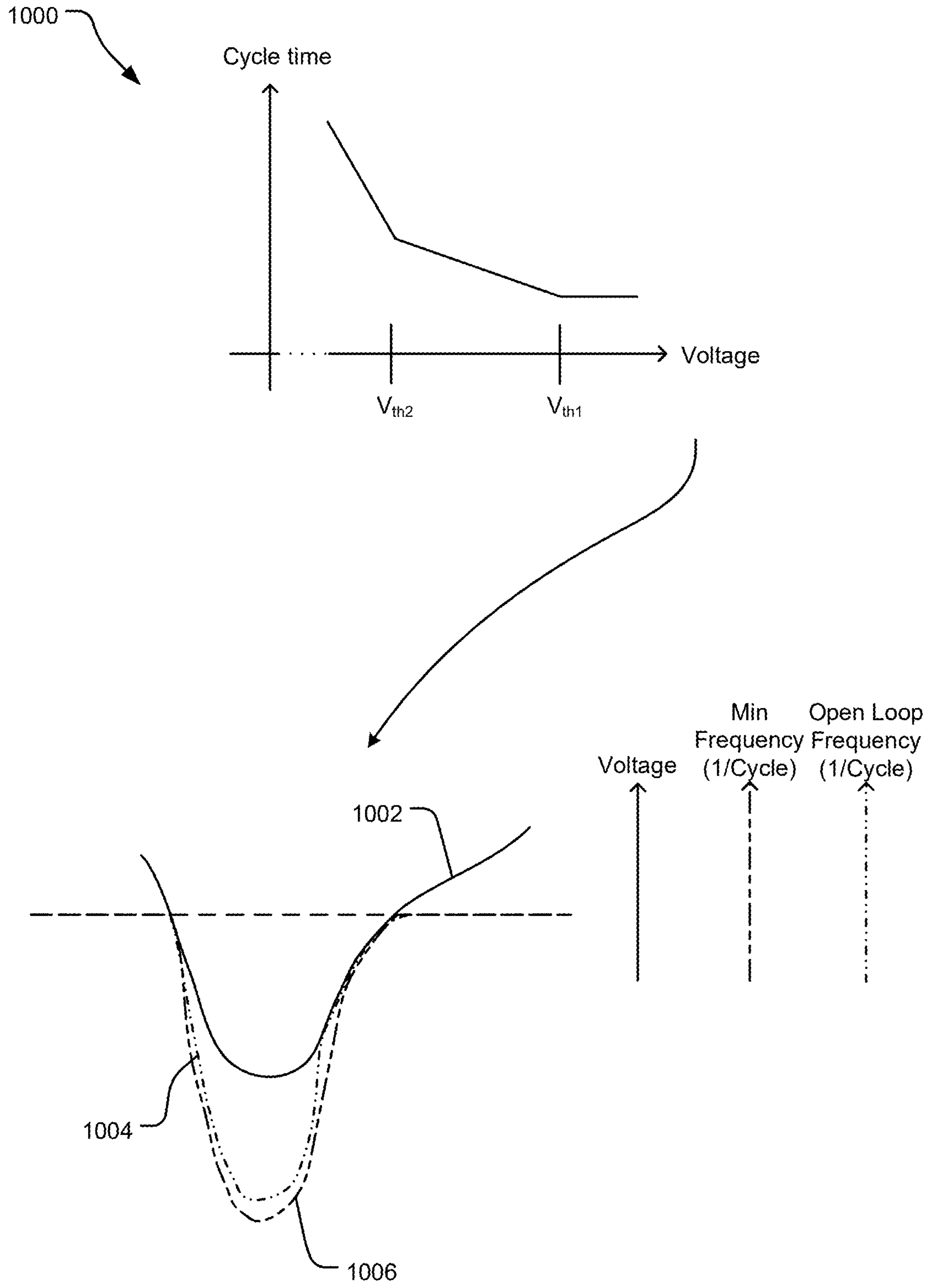
FIG. 10 illustrates a graph that shows relation between the voltage and the cycle time for a clocking system with multiple Gm cells.
Figure 11:
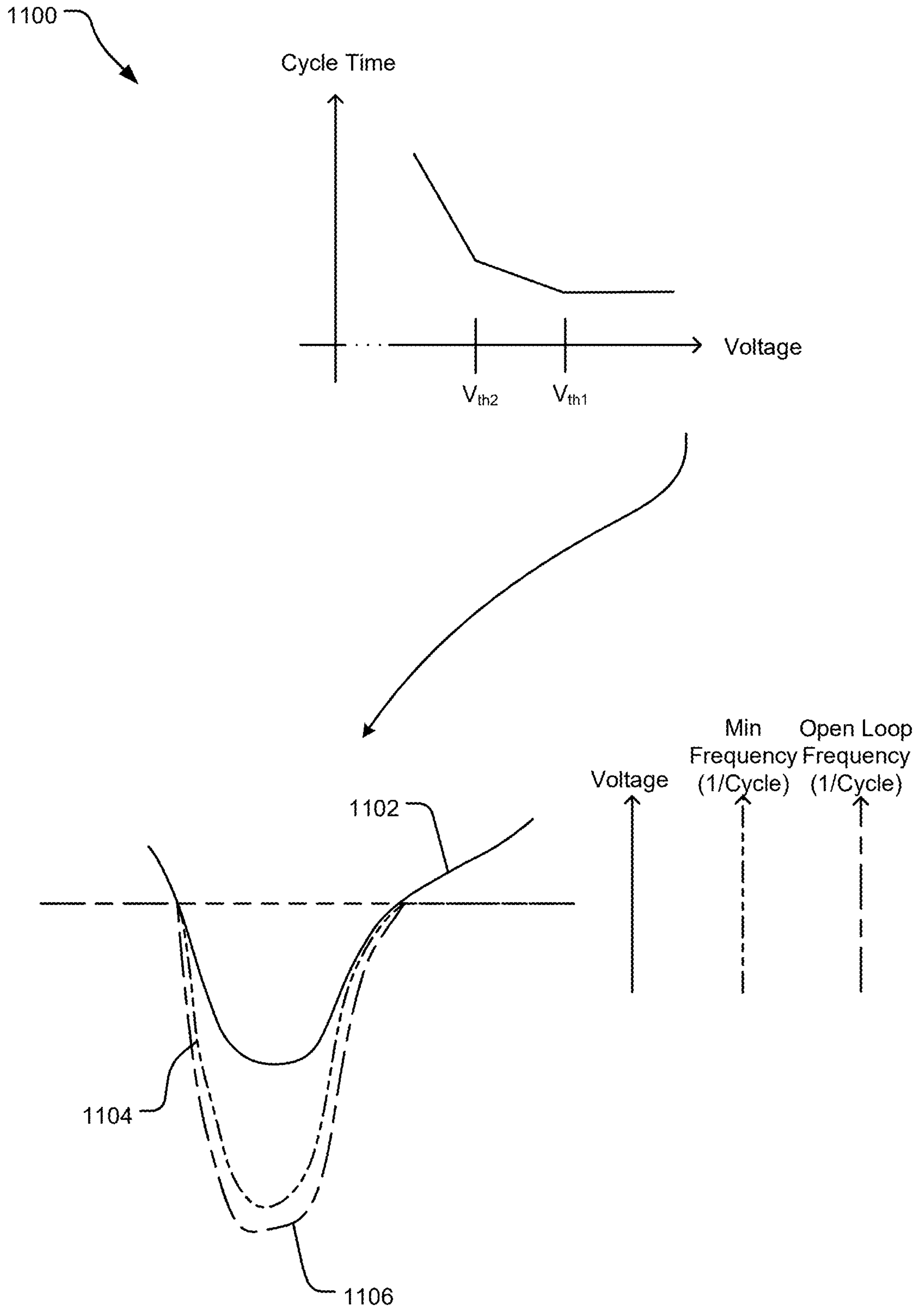
FIG. 11 illustrates an alternative graph that shows relation between the voltage and the cycle time for a clocking system with multiple Gm cells.
Figure 12:
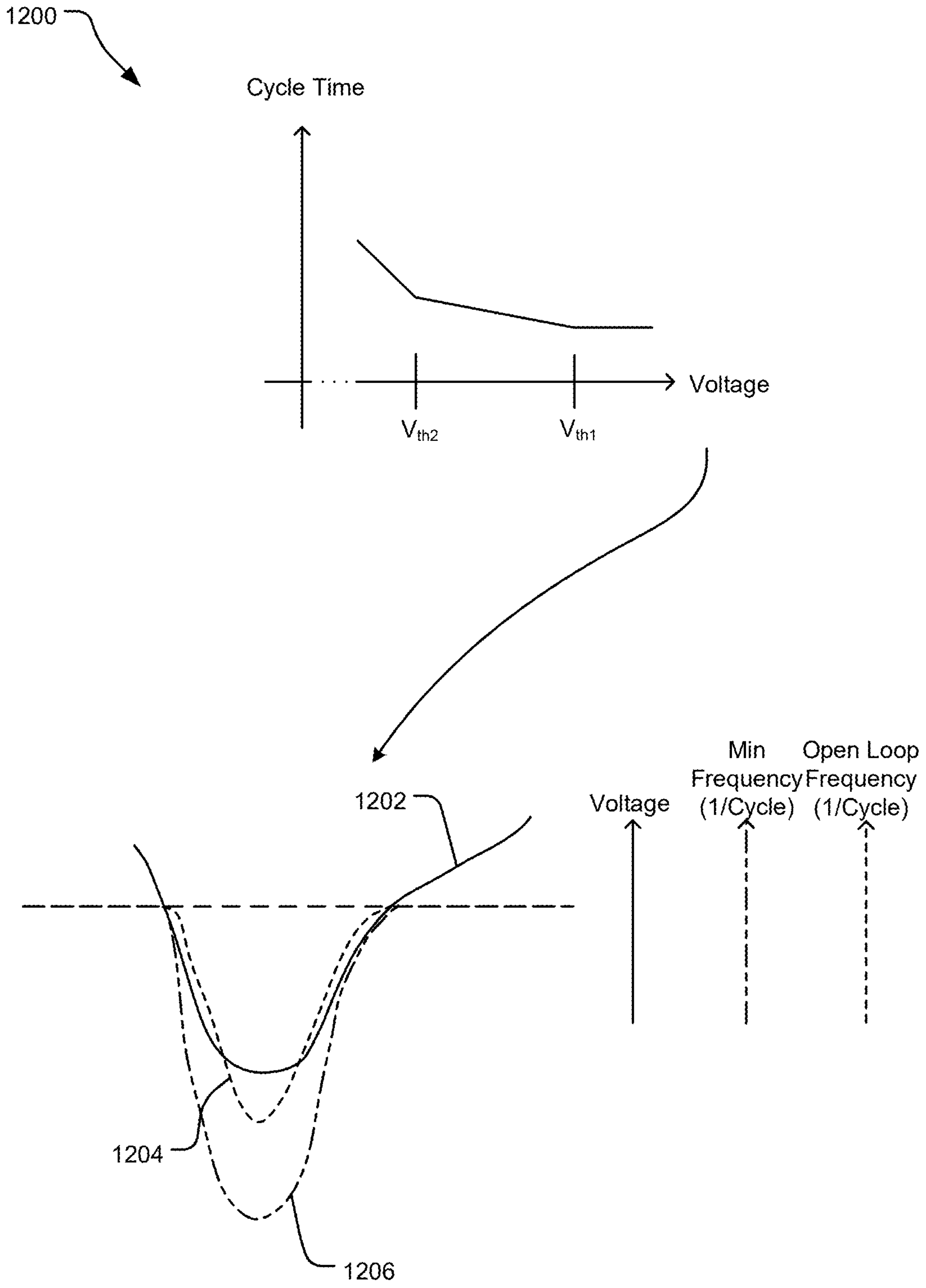
FIG. 12 illustrates an alternative graph that shows relation between the voltage and the cycle time for a clocking system with multiple Gm cells.

Now referring to FIGS. 10-12, they illustrate various graphs illustrating clock cycle time to voltage programmability based on the clocking system disclosed in FIG. 9. The clocking system disclosed herein allows the threshold voltage Vthres for the Gm module to be programmable as well as the gain past each threshold voltage level to be programmable as well.

For example, FIG. 10 illustrates a graph 1000 that shows relation between the voltage and the cycle time with the Vthres being at $Vth_1$ and $Vth_2$. On the other hand, FIG. 11 illustrates a graph 1100 that shows relation between the voltage and the cycle time for an implementation of the clocking system 900 with the Vthres being at $Vth_3$ and $Vth_4$ with $Vth_3$ and $Vth_4$ being different than the $Vth_1$ and $Vth_2$, whereas the gain of the two Gm cells 902 and 904 being the same for each implementation. Compared to that, FIG. 12 illustrates a graph 1200 that shows relation between the voltage and the cycle time for an implementation of the clocking system 900 with the Vthres being the same as $Vth_1$ and $Vth_2$, however, the gains of the two Gm cells 902 and 904 being different than the implementation with the graph in FIG. 10.

Additionally, FIG. 10 also includes another graph 1010 that illustrates the droop in the voltage Vsup_sense 1002, open loop frequency 1004, and minimum frequency 1006. Here, the minimum frequency 1006 is the effective minimum frequency of the clock domain that is supported by the clocking system. Specifically, 1006 illustrates critical cycle timing path that may get tripped due to the droop in the voltage. As shown, by using the clocking system with the threshold and gain values as per the implementation in FIG. 10, the open loop frequency 1004 is slightly above the minimum frequency, and therefore, it does not provide complete protection to the SoC from the droop in the voltage Vsup_sense 1002, however, it is close.

On the other hand, in FIG. 11, the open loop frequency 1104 is below the minimum frequency 1106 and thus this implementation protects the SoC from the droop in the voltage Vsup_sense 1202. In FIG. 12, the droop in the voltage Vsup_sense 1202 when the Gm cells 902, 904 are provided with different thresholds and different gains between the thresholds. This implementation does not provide protection to the SoC from the droop in the voltage Vsup_sense 1202 as the open loop frequency 1204 is significantly above the minimum frequency 1206.

Figure 13:
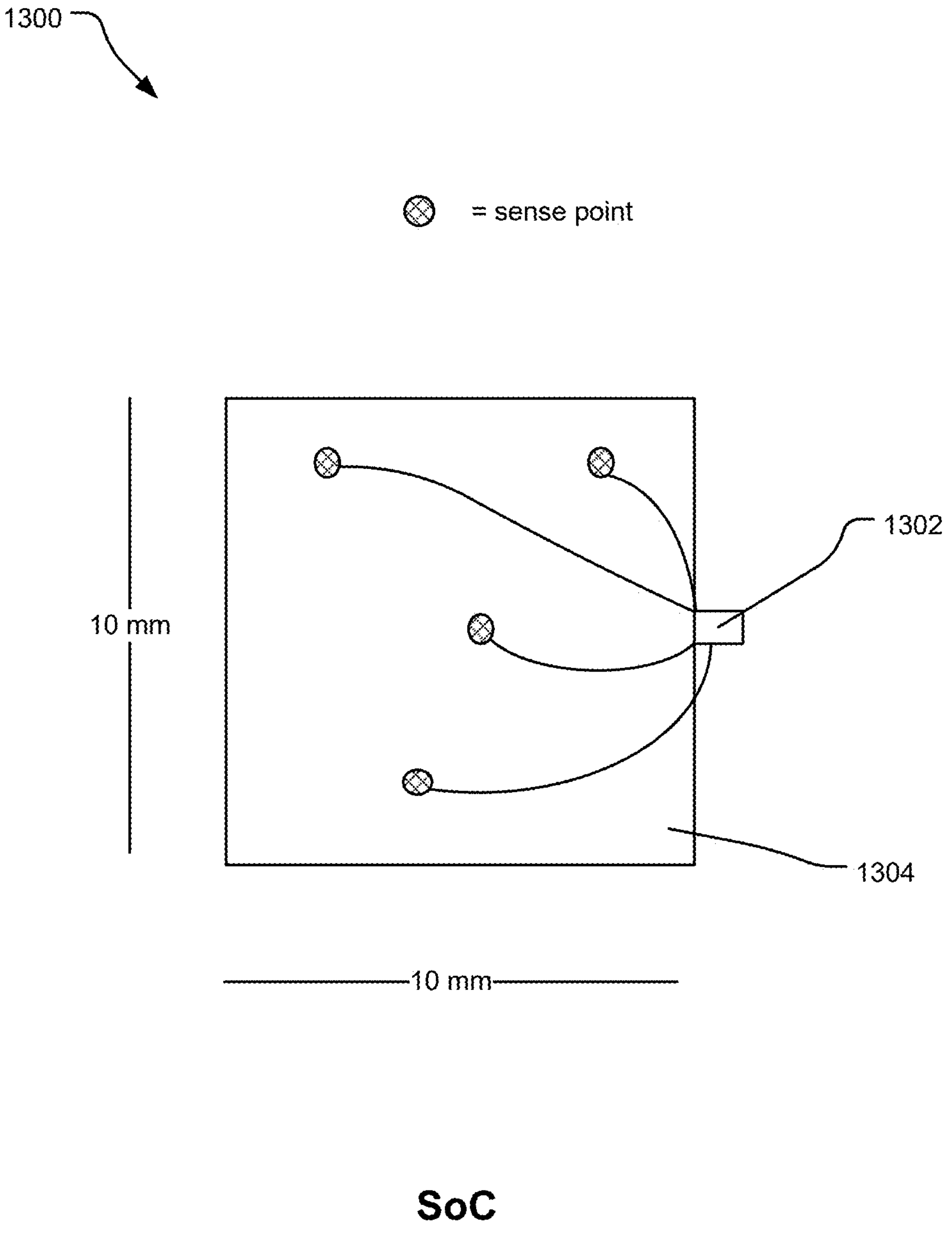
FIG. 13 illustrates an SoC with a clock domain area having multiple sense points.

Now referring to FIG. 13, it illustrates an SoC 1300 with a clock domain area 1304 having multiple sense points 1310*a*, 1310*b*, etc., where the Vsup_sense signal may be collected for a clocking system 1302 having a plurality of Gm cells. Thus, for example, the Vsup-sense at sense point 1310*a* may be used as input to a first Gm in the clocking system 1302, the Vsup-sense at sense point 1310*b* may be used as input to a second Gm in the clocking system 1302, etc. Furthermore, the thresholds Vthres of each of the Gm cells in the clocking system 1302 may also be programmed separately and such threshold may depend on the location of the sense points. For example, such thresholds Vthres for each of the sense points may depend on the expected local supply droops at these sense points, expected local slope di/dt of the drain current at the sense point, etc.

In the illustrated implementation, the size of the clock domain 1304 is 10×10 mms, however, in alternative implementations, other size of clock domains may be used. The sense points 1310 may be located where high current drain areas or critical timing areas of the SoC 1300.

An implementation provides a device including a phase locked loop (PLL) circuit, the PLL circuit including a voltage controlled oscillator (VCO) and a phase detector, and a voltage supply and transconductance cell (Gm) configured to drain a current Iout from the VCO based on a sensed voltage (Vsup_sense) input into the Gm, wherein the Gm cell is configured to generate an open_loop signal based on the Iout drain from the VCO.

In another implementation, a clocking system disclosed herein includes a phase locked loop (PLL) circuit, the PLL circuit including a voltage-controlled oscillator (VCO) and a phase detector; and a plurality of voltage supply and transconductance cells (Gm), wherein each of the plurality of Gm cells is configured to receive a threshold voltage Vthres and a sensed voltage Vsup_sense as inputs, each of the plurality of Gm cells is configured to drain a current Iout from the VCO based on a difference between the Vsup_sense and the Vthres, and each of the plurality of Gm cells is configured to generate an open_loop signal based on the Iout drain from the VCO.

A system disclosed herein includes a phase locked loop (PLL) circuit, the PLL circuit including a voltage-controlled oscillator (VCO) and a phase detector and a voltage supply and transconductance cell (Gm) configured to drain a current Iout from the VCO based on a difference between a sensed voltage (Vsup_sense) and a threshold voltage (Vthres) input into the Gm, wherein the Gm cell is configured to: generate an open_loop signal based on the Iout drain from the VCO.

What is claimed is:

1. A device, comprising:

a phase locked loop (PLL) circuit, the PLL circuit including a voltage-controlled oscillator (VCO) and a phase detector; and a voltage supply and transconductance (Gm) cell that, in operation, drains a current Iout from the VCO based on a sensed voltage (Vsup_sense) input into the Gm cell, wherein the Gm cell, in operation, generates an open_loop signal based on the Iout drained from the VCO, and the open_loop signal is input into the phase detector of the PLL to switch the operation of the PLL between an open loop state and a closed loop state.

2. The device of claim 1, wherein the open_loop signal is input into the phase detector to switch operation of the phase detector between the closed loop state and the open loop state, and wherein, in the open loop state, a cycle time of an output of the VCO is dependent on the sensed voltage (Vsup_sense).

3. The device of claim 1, wherein the Gm cell is configured to:

receive a threshold voltage (Vthres) input, and drain the current Iout from the VCO based on a difference between the Vthres and the Vsup_sense.

4. The device of claim 3, wherein the Vthres input into the Gm cell is programmable.

5. The device of claim 1, wherein the Gm cell is further configured to provide a gain to the Iout drained from the VCO to generate the open_loop signal.

6. The device of claim 1, wherein, during a transition from the open loop state to the closed loop state, a phase rotator increases a cycle time of an output clock signal from the VCO.

7. The device of claim 1, wherein the open_loop signal is input into a phase rotator state machine (PRSM) that is configured to generate a phase rotation state signal to rotate a phase of an output clock signal output from the VCO.

8. The device of claim 7, further comprising a phase rotator (PR) configured to receive the output clock signal from the VCO and rotate the phase of the output clock signal from the VCO based on the phase rotation state signal.

9. The device of claim 1, wherein the phase detector is configured to:

receive a reference clock signal and a feedback clock signal; and generate an output current based on a difference between the reference clock signal and the feedback clock signal in the closed loop state.

10. The device of claim 1, wherein, in response to receiving the open_loop signal with a value of zero (0), the phase detector operates in the open loop state wherein the phase detector provides a constant output current.

11. A clocking system, comprising:

a phase locked loop (PLL) circuit, the PLL circuit including a voltage-controlled oscillator (VCO) and a phase detector; and a plurality of voltage supply and transconductance (Gm) cells, wherein:

each of the plurality of Gm cells is configured to receive a threshold voltage Vthres and a sensed voltage Vsup_sense as inputs, each of the plurality of Gm cells is configured to drain a current Iout from the VCO based on a difference between the Vsup_sense and the Vthres, and each of the plurality of Gm cells is configured to generate an open_loop signal based on the Iout drained from the VCO.

12. The clocking system of claim 11, wherein the Vthres of each of the plurality of Gm cells is programmable.

13. The clocking system of claim 11, further comprising a multiplexer to multiplex the open_loop signals from each of the plurality of Gm cells to generate a PLL open_loop signal that is input into the phase detector.

14. The clocking system of claim 13, further comprising a phase rotator state machine (PRSM) configured to receive the PLL open_loop signal and to generate a phase rotation (PR) state signal.

15. The clocking system of claim 14, further comprising a phase rotator (PR) configured to receive the PR state signal and to rotate the phase of an output clock signal from the VCO using the PR state signal.

16. The clocking system of claim 11, wherein each of the pluraliy of Gm cells is further configured to receive the Vsup_sense from a different sense point on an SoC clock domain.

17. The clocking system of claim 11, wherein the phase detector is configured to:

receive a reference clock signal and a feedback clock signal; and generate an output current based on a difference between the reference clock signal and the feedback clock signal in a closed loop state.

18. A system on chip, comprising:

a phase locked loop (PLL) circuit, the PLL circuit including a voltage-controlled oscillator (VCO) and a phase detector; and a voltage supply and transconductance (Gm) cell configured to drain a current Iout from the VCO based on a difference between a sensed voltage (Vsup_sense) and a threshold voltage (Vthres) input into the Gm cell, wherein the Gm cell is configured to generate an open_loop signal based on the Iout drained from the VCO, and the open loop signal is input into the phase detector of the PLL to switch the operation of the PLL between an open loop state and a closed loop state.

19. The system on chip of claim 18, wherein the Vthres input into the Gm cell is programmable.

20. The system on chip of claim 18, wherein, in the open loop state, the phase detector provides a constant output current irrespective of a phase offset between a reference clock signal and a feedback clock signal.

* * * * *